US011245026B2

(12) United States Patent
Tsai et al.

(10) Patent No.: US 11,245,026 B2
(45) Date of Patent: Feb. 8, 2022

(54) MEMORY DEVICES (71) Applicant: Winbond Electronics Corp., Taichung (TW)

(72) Inventors: Yi-Tsung Tsai, Taichung (TW); Chia-Wei Wu, Taichung (TW); Chih-Hao Lin, Taichung (TW); Chien-Chih Li, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 13 days.

(21) Appl. No.: 16/692,186

(22) Filed: Nov. 22, 2019

(65) Prior Publication Data
US 2021/0159235 A1 May 27, 2021

(51) Int. Cl.
H01L 29/792 (2006.01)
H01L 29/66 (2006.01)
H01L 27/11521 (2017.01)
H01L 21/3213 (2006.01)
H01L 21/02 (2006.01)
H01L 29/423 (2006.01)
H01L 29/788 (2006.01)
(Continued)

(52) U.S. Cl.
CPC ...... H01L 29/6656 (2013.01); H01L 21/0228 (2013.01); H01L 21/32137 (2013.01); H01L 27/11521 (2013.01); H01L 29/42324 (2013.01); H01L 29/665 (2013.01); H01L 29/66825 (2013.01); H01L 29/788 (2013.01); H01L 21/823443 (2013.01); H01L 21/823468 (2013.01); H01L 21/823864 (2013.01)

(58) Field of Classification Search
CPC ........... H01L 27/11521; H01L 21/0228; H01L 21/32137; H01L 29/6656; H01L 29/66825; H01L 29/665; H01L 29/42324; H01L 21/28518; H01L 29/788; H01L 21/0217; H01L 21/823443; H01L 21/823468; H01L 21/823864; H01L 29/66507
See application file for complete search history.

(56) References Cited

U.S. PATENT DOCUMENTS 5,856,223 A * 1/1999 Wang ................ H01L 27/11521
438/264
7,786,004 B2 8/2010 Fukuhara
(Continued)

FOREIGN PATENT DOCUMENTS

TW I462152 B 11/2014
TW 201907519 A 2/2019

OTHER PUBLICATIONS

TW Office Action and Search Report Based on Corresponding Application No. TW108127680; dated Mar. 10, 2020.

Primary Examiner — Shouxiang Hu
(74) Attorney, Agent, or Firm — Muncy, Geissler, Olds & Lowe, P.C.

(57) ABSTRACT

A memory device and a method for forming the same are provided. The method includes forming a plurality of gate structures on a substrate, forming a first spacer on opposite sides of the gate structures, filling a dielectric layer between adjacent first spacers, forming a metal silicide layer on the gate structures, conformally forming a spacer material layer over the metal silicide layer, the first spacer layer and the dielectric layer, and performing an etch back process on the spacer material layer to form a second spacer on opposite sides of the metal silicide layer.

6 Claims, 8 Drawing Sheets (51) Int. Cl.
  *H01L 21/8234* (2006.01)
  *H01L 21/8238* (2006.01)

(56) References Cited

U.S. PATENT DOCUMENTS

| | | | |
|---|---|---|---|
| 9,153,656 B2 * | 10/2015 | Iinuma | H01L 29/42324 |
| 9,275,904 B2 | 3/2016 | Whang et al. | |
| 10,325,916 B2 * | 6/2019 | Chiu | H01L 29/40114 |
| 10,438,957 B2 * | 10/2019 | Tsai | H01L 23/535 |
| 2013/0161751 A1 * | 6/2013 | Chung | H01L 27/088 |
| | | | 257/368 |

* cited by examiner

MEMORY DEVICES

BACKGROUND

Field of the Invention

The present invention relates to semiconductor technology in particular to memory devices and methods for forming the same.

Description of the Related Art

A flash memory is a non-volatile memory with large capacity, high read/write speed, low power consumption and low cost. Since flash memory is non-volatile, data can remain in a flash memory after the flash memory has been powered off Therefore, flash memory can be used widely.

As semiconductor devices are scaled down, it is becoming increasingly difficult to manufacture memory devices. Unwanted defects may be generated during the manufacturing of memory devices, and such defects may cause damage to the memory devices, affecting performance. Therefore, continuous improvements to the memory devices are required in order to improve the yield.

BRIEF SUMMARY

In some embodiments of the disclosure, a method for forming a memory device is provided. The method includes forming a plurality of gate structures on a substrate and forming a first spacer on opposite sides of the gate structures. The method also includes filling a dielectric layer between adjacent first spacers and forming a metal silicide layer on the gate structures. The method also includes conformally forming a spacer material layer over the metal suicide layer, the first spacer layer and the dielectric layer, and performing an etch back process on the spacer material layer to form a second spacer on opposite sides of the metal silicide layer.

In some embodiments of the disclosure, a memory device is provided. The memory device includes a plurality of gate structures disposed on a substrate and a first spacer disposed on opposite sides of the gate structures. The memory device also includes a dielectric layer disposed between adjacent first spacers, a metal silicide layer disposed on the gate structures, and a second spacer on opposite sides of the metal silicide layer.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following disclosure provides many different embodiments, or examples, for implementing different features of the high-voltage semiconductor device provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIGS. 1A-1H show cross sections of various stages of a method for forming a memory device 100 according to an embodiment of the invention. Additional processes can be provided before, during or after the steps of the embodiment. In different embodiments, some processes can be moved, omitted or replaced. Additional features can be added to the memory device. In different embodiments, some features described below can be moved, omitted or replaced.

Figure 1A:
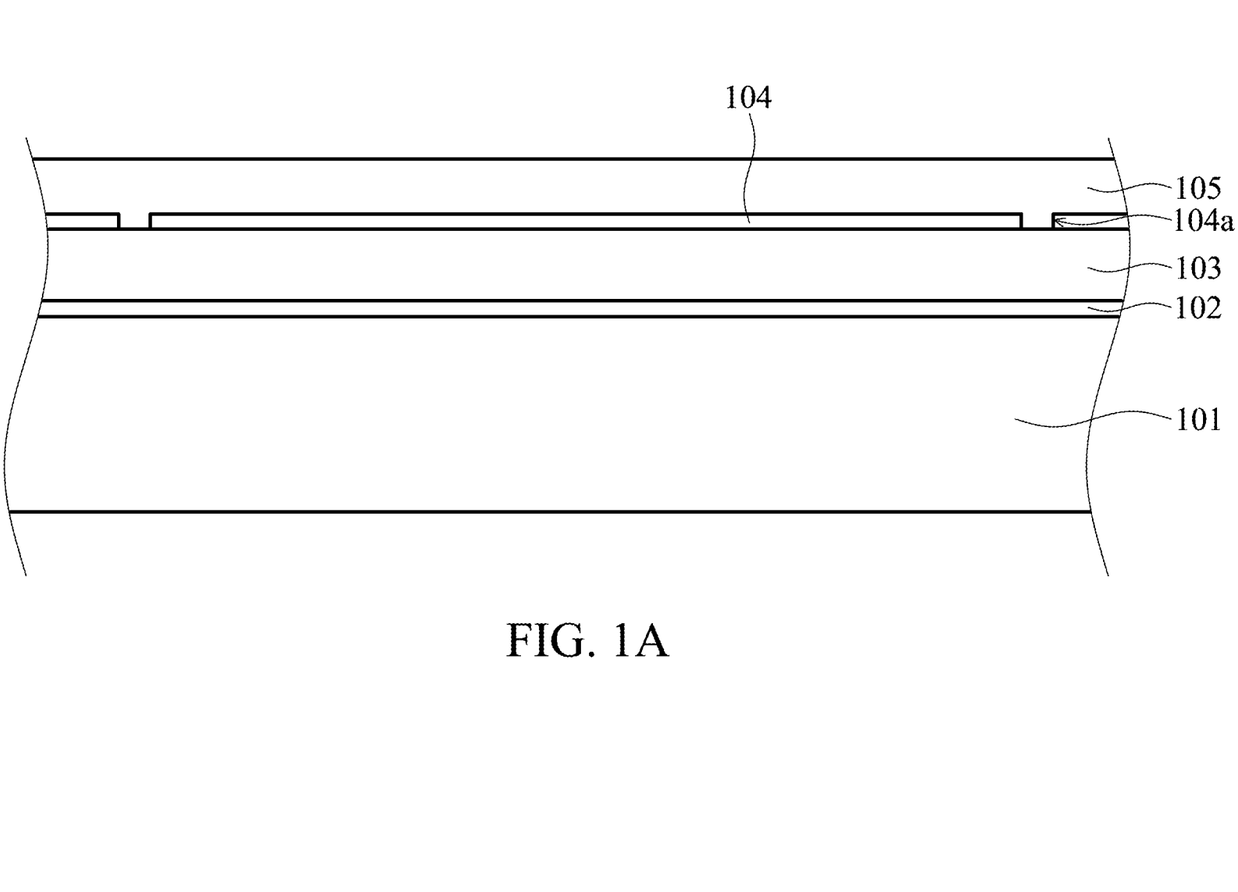
FIGS. 1A-1H show cross sections of various stages of a method for forming a memory device according to an embodiment of the invention.

First, as shown in FIG. 1A, a substrate 101 is provided, and a dielectric layer 102, a first gate electrode material layer 103, a dielectric layer 104 and a second gate electrode material layer 105 are sequentially formed on the substrate 101. In an embodiment, the substrate 101 is made of silicon or another semiconductor material. Alternatively, the substrate 101 may include another element semiconductor material, such as germanium (Ge). In an embodiment, the substrate 101 may be made of compound semiconductor, such as silicon carbide, gallium nitride, gallium arsenide, indium arsenide or indium phosphide. In an embodiment, the substrate 101 includes silicon-on-insulator (SOI) substrate or another suitable substrate. In an embodiment, the substrate 101 has doped well regions (not shown) and shallow trench isolation (STI) regions within. The doped well regions are electrically isolated from one another by the STI regions.

The dielectric layer 102 serves as a tunneling oxide film of the memory device. In an embodiment, the material of the dielectric layer 102 may be silicon oxide, hafnium oxide, zirconium oxide, aluminum oxide, aluminum hafnium dioxide alloy, silicon hafnium dioxide, silicon hafnium oxynitride, tantalum hafnium oxide, titanium hafnium oxide, zirconium hafnium oxide, or a combination thereof.

The first gate electrode material layer 103 will later serve as a floating gate of the memory device. In an embodiment, the first gate electrode material layer 103 may be formed of amorphous silicon, polysilicon, one or more metals, metal nitride, metal silicide, conductive metal oxide or a combination thereof. Specifically, the above-mentioned metal may comprise Mo, W, Ti, Ta, Pt or Hf, but it is not limited thereto. The above-mentioned metal nitride may comprise MoN, WN, TiN and TaN, but it is not limited thereto. The above-mentioned metal silicide may comprise $WSi_x$, but it is not limited thereto. The above-mentioned conductive metal oxide may comprise $RuO_2$ and indium tin oxide (ITO), but it is not limited thereto.

The dielectric layer 104 serves as an inter-gate dielectric layer of the memory device. In an embodiment, the dielectric layer 104 has an opening 104a. In an embodiment, the dielectric layer 104 may be oxide-nitride-oxide (ONO) structure, such as silicon oxide-silicon silicon nitride-silicon oxide.

The second gate electrode material layer 105 will later serve as a control gate of the memory device. The second gate electrode material layer 105 fills the opening 104a of the dielectric layer 104. In an embodiment, the second gate electrode material layer 105 may be formed of amorphous silicon, polysilicon or a combination thereof. In an embodiment, the material of the second gate electrode material layer 105 is the same as that of the first gate electrode material layer 103. In other embodiments, the material of the second gate electrode material layer 105 is different from that of the first gate electrode material layer 103.

Figure 1B:
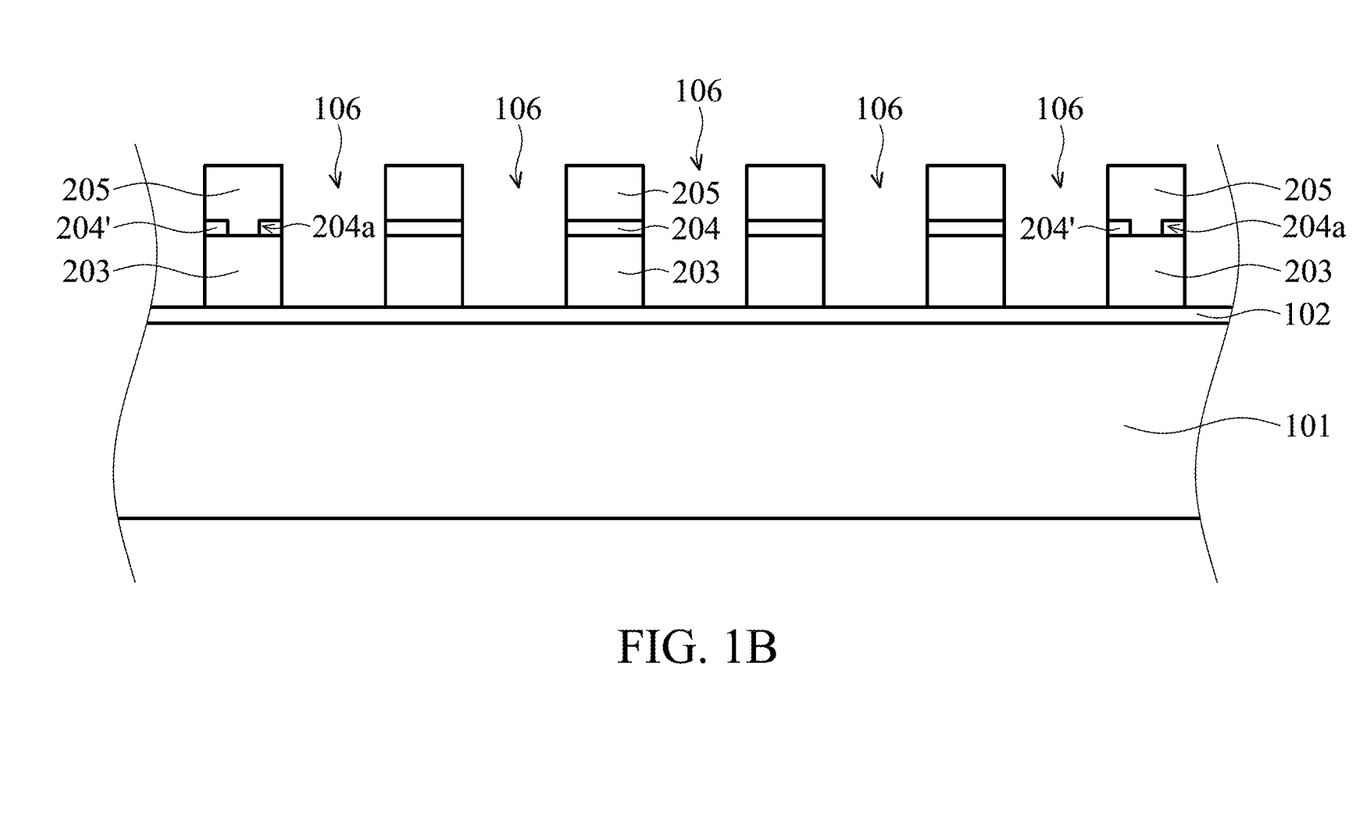

Then, as shown in FIG. 1B, the first gate electrode material layer 103, the dielectric layer 104 and the second gate electrode material layer 105 are patterned by a lithography process and an etching process to form memory unit transistors and select gate transistors. Each of the memory unit transistors has a gate structure comprising a first gate electrode 203, a gate dielectric layer 204 and a second gate electrode 205. Each of the select gate transistors has a gate structure comprising a first gate electrode 203, a gate dielectric layer 204' and a second gate electrode 205. The gate dielectric layer 204' has an opening 204a. An opening 106 is between adjacent memory unit transistors. In an embodiment, the etching process may be dry etch process, wet etch process, plasma etching process, reactive ion etching process, another suitable process or a combination thereof.

Figure 1C:
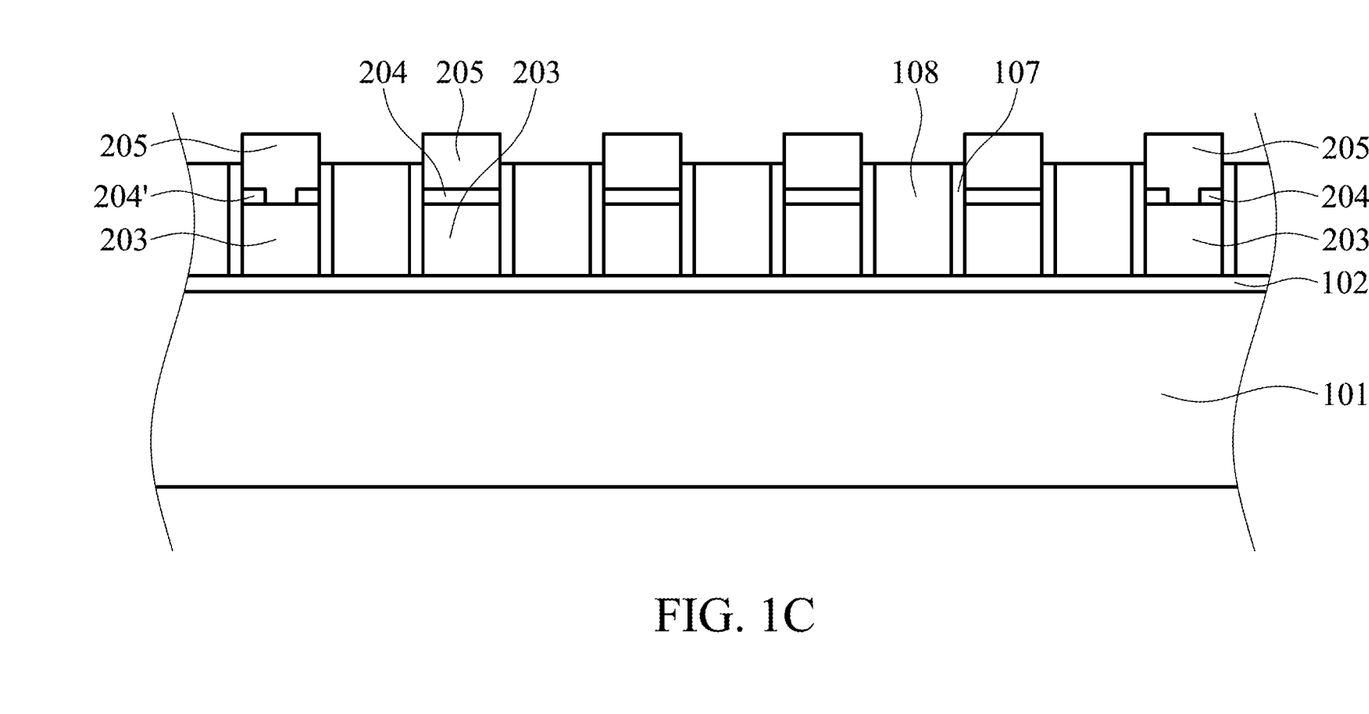

Then, as shown in FIG. 1C, a spacer 107 is formed on opposite sides of the gate structure. The top surface of the spacer 107 is lower than the top surface of the second gate electrode 205. In an embodiment, the top surface of the spacer 107 is higher than the top surfaces of the gate dielectric layer 204 and the gate dielectric layer 204'. In an embodiment, the material of the spacer 107 may be silicon oxide, silicon nitride, silicon oxynitride, a combination thereof or another suitable insulating material. In an embodiment, the spacer 107 may be formed by a conformal deposition process, a lithography process and an etching process. In an embodiment, the conformal deposition process may be physical vapor deposition (PVD) process, chemical vapor deposition (CVD) process, atomic layer deposition (ALD) process, evaporation, another suitable process or a combination thereof. In an embodiment, the etching process may be dry etch process.

Referring to FIG. 1C, a dielectric layer 108 is filled between adjacent spacers 107. The top surface of the dielectric layer 108 is lower than the top surface of the second gate electrode 205. The spacer 107 and the dielectric layer 108 completely fill the opening 106. In an embodiment, the top surface of the dielectric layer 108 is higher than the top surfaces of the gate dielectric layer 204 and the gate dielectric layer 204'. In an embodiment, the top surface of the dielectric layer 108 is level with the top surface of the spacer 107. In an embodiment, the dielectric layer 108 may be tetraethoxysilane (TEOS), low-k dielectric material or another suitable dielectric material. In an embodiment, the dielectric layer 108 may be formed by a deposition process, a lithography process and an etching process. In an embodiment, the deposition process may be PVD process, CVD process, ALD process, evaporation, another suitable process or a combination thereof. In an embodiment, the etching process may be dry etch process.

Figure 1D:
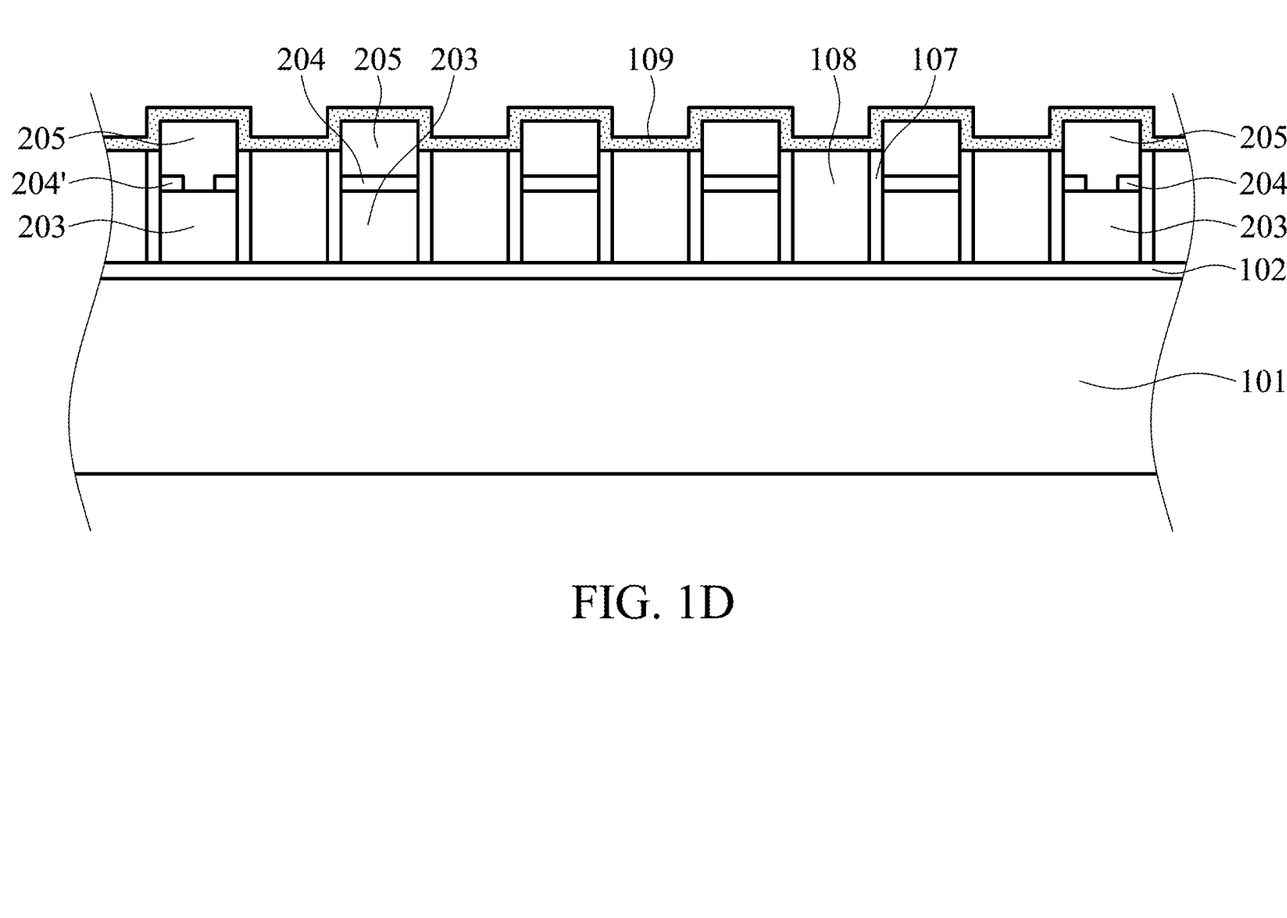

Then, as shown in FIG. 1D, a metal layer 109 is formed over the second gate electrode 205, the spacer 107 and the dielectric layer 108. In the embodiment, the metal layer 109 conformally covers the second gate electrode 205, the spacer 107 and the dielectric layer 108. In an embodiment, the metal layer 109 may be Co, Ti or another suitable metal material. In an embodiment, the metal layer 109 may be formed by PVD process, CVD process, ALD process, evaporation, another suitable process or a combination thereof.

Figure 1E:
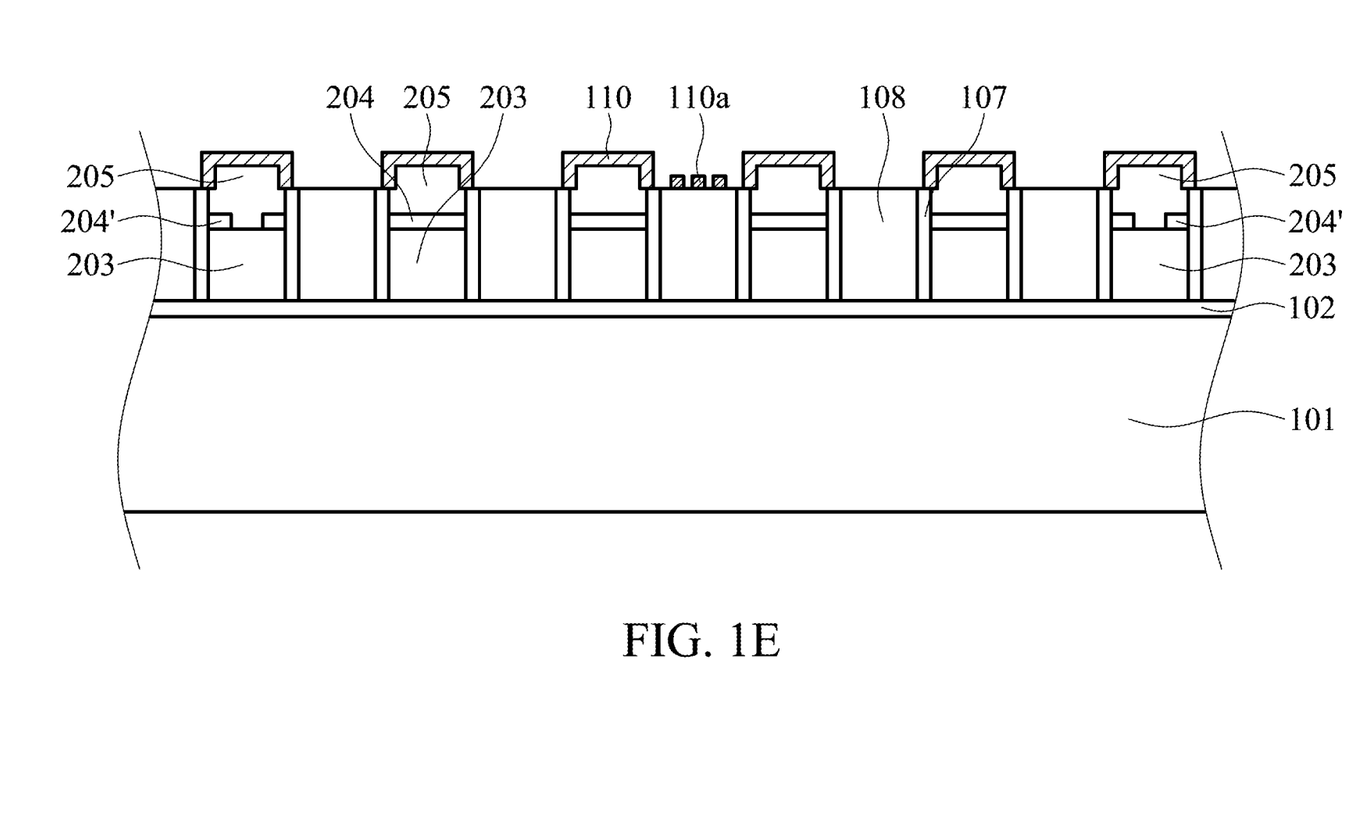

Then, referring to FIG. 1E, an annealing process is performed on the metal layer 109 so that the metal layer 109 reacts with the silicon material of the second gate electrode 205 to form a metal silicide layer 110. In an embodiment, the metal silicide layer 110 has residue 110a. The residue 110a is on the spacer 107 and the dielectric layer 108. In an embodiment, the metal silicide layer 110 may be a $CoSi_2$. In an embodiment, the temperature of the annealing process may be in a range between 500° C. and 850° C.

Figure 1F:
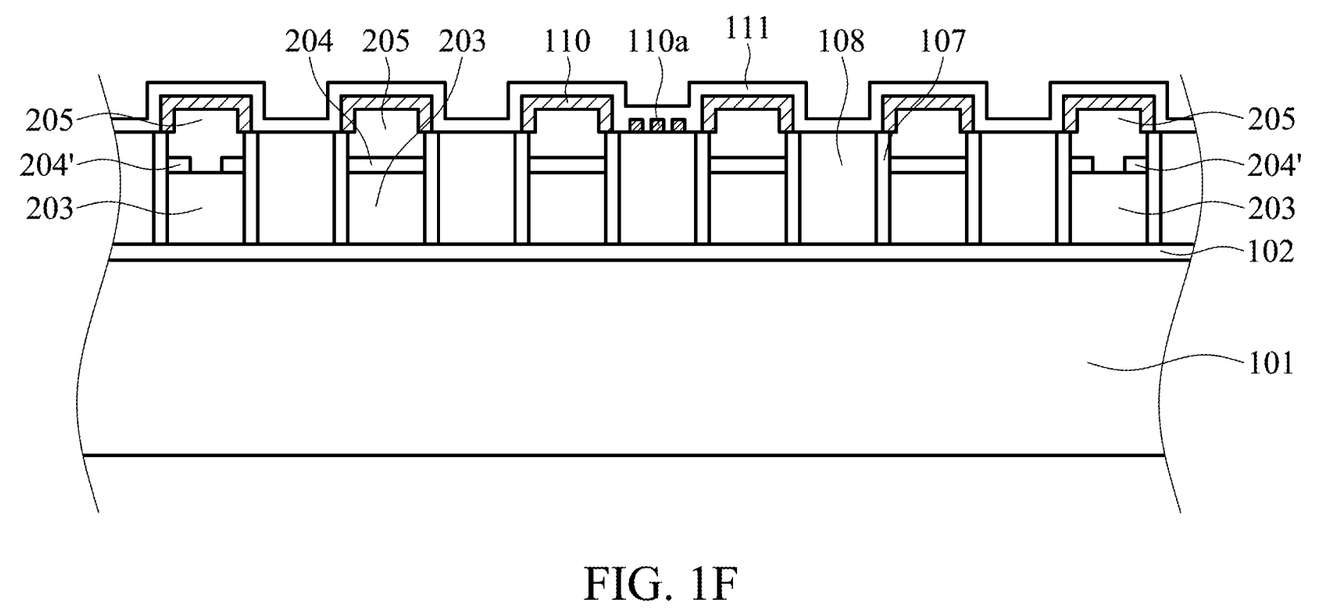

Then, as shown in FIG. 1F, a spacer material layer III is conformally formed over the metal silicide layer 110, the spacer 107 and the dielectric layer 108. In an embodiment, the spacer material layer 111 may be silicon oxide, silicon nitride, silicon oxynitride, a combination thereof or another suitable insulating material. In the embodiment, the spacer material layer 111 is silicon nitride. In an embodiment, the material of the spacer material layer 111 is different from that of the spacer 107. In the embodiment, the spacer material layer 111 may be formed by an ALD process, and the temperature of the ALD process is about 550° C. In other embodiments, the spacer material layer 111 may be formed by PVD process, CVD process, evaporation, another suitable process or a combination thereof.

Figure 1G:
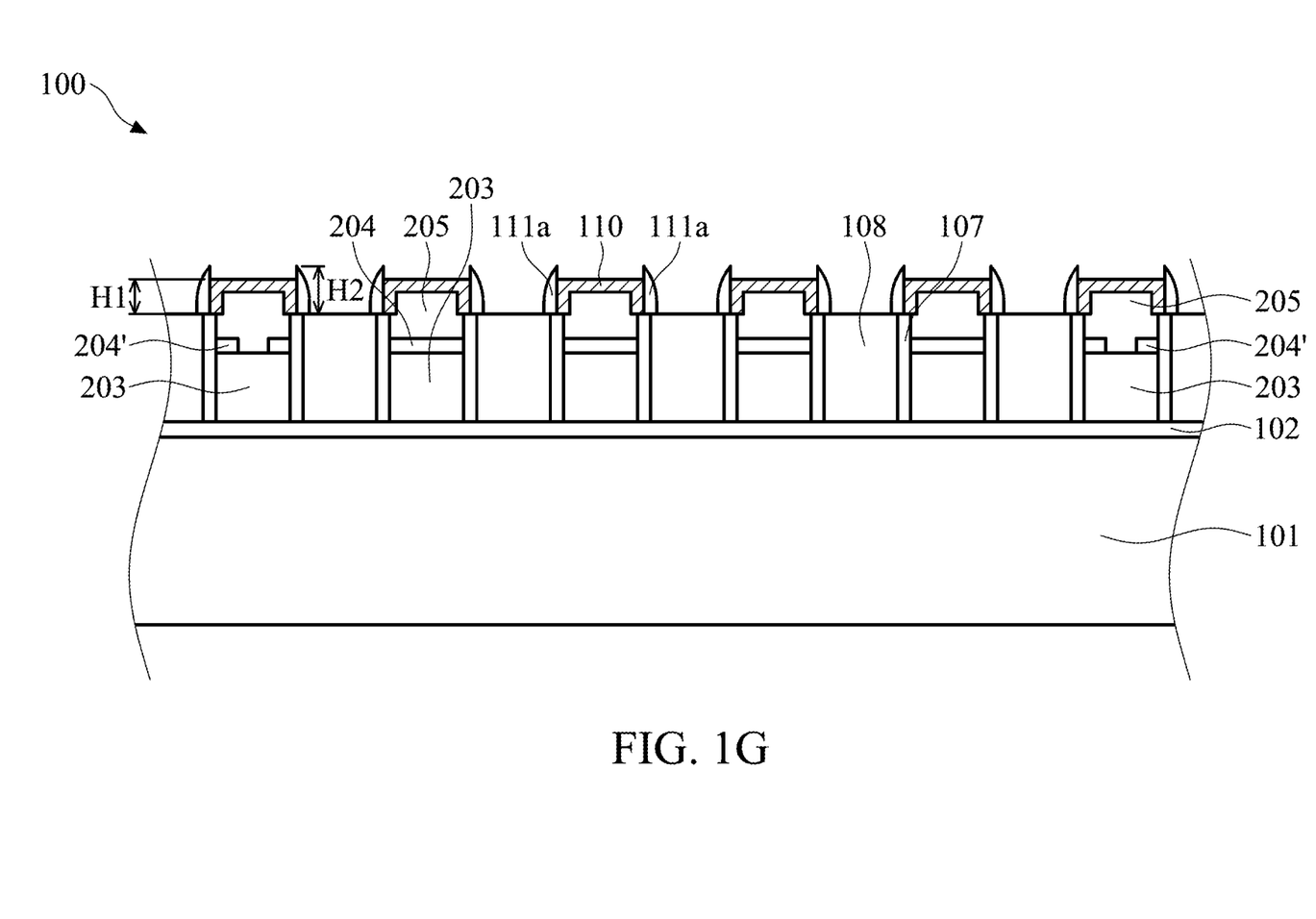

Then, according to an embodiment, a first etch back process is performed to form a spacer 111a on opposite sides of the metal silicide layer 110. In an embodiment, the first etch back process is dry etch process. In the embodiment, the top surface of the spacer 111a is higher than the top surface of the metal silicide layer 110. In other words, the spacer 111a protrudes over the top surface of the metal silicide layer 110. According to an embodiment, the top surface of the spacer 111a is higher than the top surface of the metal silicide layer 110, so that the sidewalls of the metal silicide layer 110 is better protected by the spacer 111a. In an embodiment, the metal silicide layer 110 has a height $H_1$, and the spacer 111a has a height $H_2$. The height $H_2$ is larger than the height $H_1$. In other embodiments, the top of the spacer 111a is level with the top of the metal silicide layer 110. In other embodiments, the top of the spacer 111a is lower than the top of the metal silicide layer 110. In an embodiment, the spacer 111a is in direct contact with the metal silicide layer 110. In an embodiment, the bottom surface of the spacer 111a is level with the bottom surface of the metal silicide layer 110.

It should be noted that the residue 110a is removed during the first etch back process when the metal silicide layer 110 has residue 110a. Thus, short circuits between adjacent metal silicide layers 110 may be avoided, and the yield of the memory devices is thereby improved. In another embodiment, a second etch back process may be performed after the first etch back process to ensure the residue 110a is removed. In the embodiment, the first etch back process uses an etchant that includes $CF_4$ or $CHF_3$, and the second etch back process uses an etchant that includes HBr or $Cl_2$.

Figure 1H:
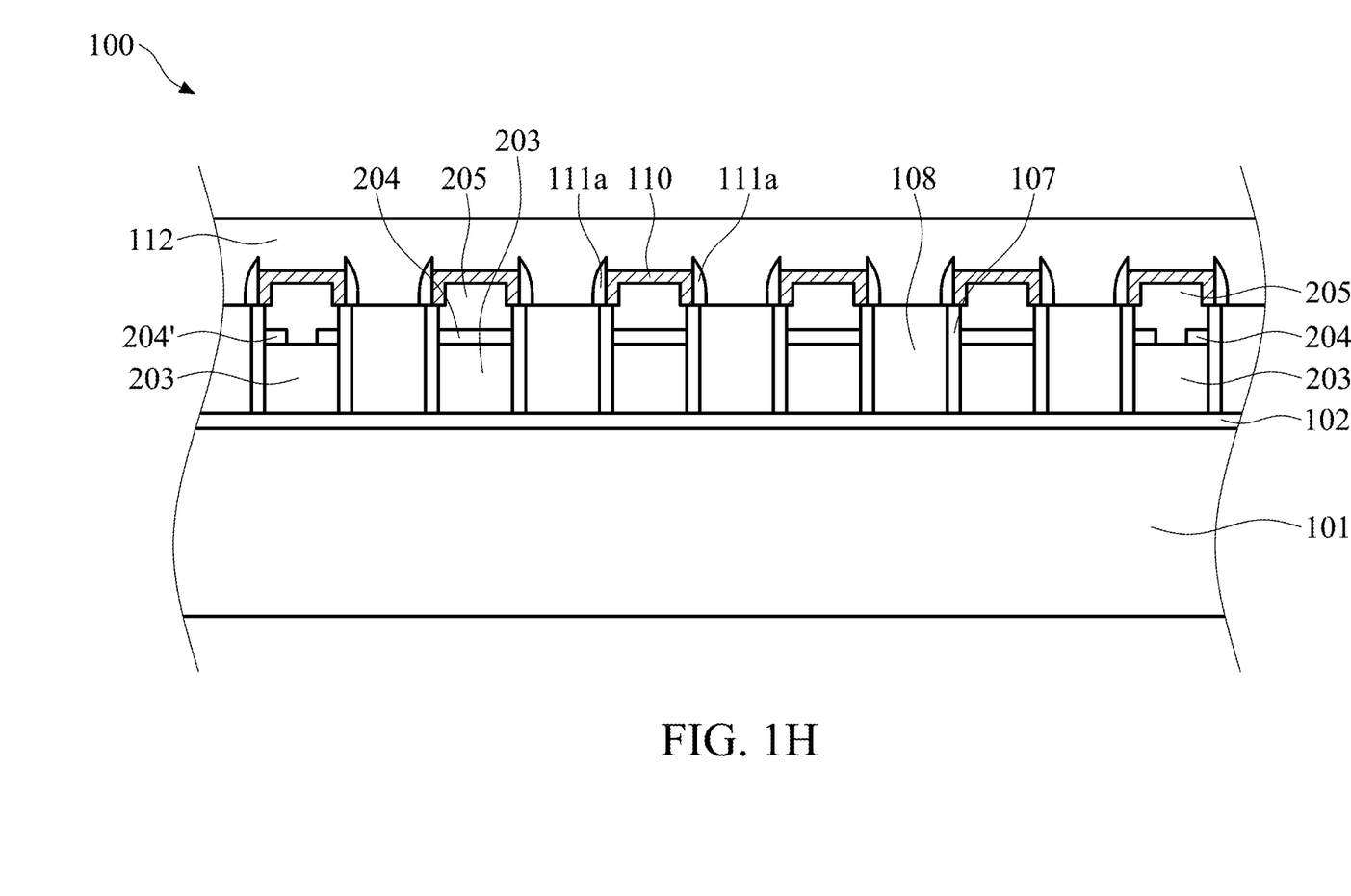

Then, as shown in FIG. 1H, a dielectric layer 112 is formed on the metal silicide layer 110, the spacer 111a, the spacer 107 and the dielectric layer 108. In an embodiment, the dielectric layer 112 completely covers the metal silicide layer 110, the spacer 111a, the spacer 107 and the dielectric layer 108, so that the dielectric layer 112 fills a gap between adjacent spacers 111a. In an embodiment, the bottom surface of the spacer 111a is level with the bottom surface of the dielectric layer 112. In an embodiment, the material of the dielectric layer 112 is the same as that of the dielectric layer 108. In an embodiment, the dielectric layer 112 may be formed by a deposition process and a planarization process. The deposition process may be a PVD process, CVD process, ALD process, evaporation, another suitable process or a combination thereof. In an embodiment, the planarization process may be a chemical mechanical polishing (CMP) process.

Then, after the formation of the dielectric layer 112, vias (not shown) and pads (not shown) may be formed through the dielectric layer 112, the dielectric layer 108 and the dielectric layer 102. In the embodiment, the vias and the pads collectively serve as contact electrodes of bit line/source line. In an embodiment, the vias and the pads may be Ag, Cu, Au, Pt, W, Po or another suitable conductive material. In an embodiment, the vias are formed by an etching process, a deposition process and a planarization process. In an embodiment, the pads are formed by a deposition process, a lithography process and an etching process. In an embodiment, after the formation of the vias and the pads, the process of the memory device 100 is accomplished.

The memory devices and methods for forming the same of the invention can be applied to various flash memories such as NOR flash memory, NAND flash memory, 3D flash memory.

In summary, according to an embodiment of the invention, by forming a spacer material layer on a metal silicide layer, and then removing the horizontal portion of the spacer material layer and the residue of the metal silicide layer using an etch back process, a spacer is formed on opposite sides of the metal silicide layer. Short circuits between adjacent metal silicide layers may thereby be avoided, and the yield of the memory devices is thereby improved.

In addition, according to an embodiment of the invention, the top surface of the spacer is higher than the top surface of the metal silicide layer, so that the sidewalls of the metal silicide layer are better protected by the spacer.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A memory device, comprising:
    a plurality of gate structures disposed on a substrate;
    first spacers disposed on opposite sides of the gate structures;
    a dielectric layer disposed between two adjacent ones of the first spacers;
    a metal silicide layer disposed on the gate structures and the first spacers; and
    second spacers on opposite sides of the metal silicide layer and on a top of each of the dielectric layer and the first spacers.

2. The memory device of claim 1, wherein the second spacers are in direct contact with the metal silicide layer.

3. The memory device of claim 1, wherein a top of the second spacers are higher than a top of the metal silicide layer.

4. The memory device of claim 1, wherein a bottom surface of each of the second spacers is level with a bottom surface of the metal silicide layer.

5. The memory device of claim 1, wherein the gate structures comprise:
    a first gate electrode;
    a gate dielectric layer disposed on the first gate electrode; and
    a second gate electrode disposed on the gate dielectric layer.

6. The memory device of claim 1, wherein each of the second spacers comprises silicon nitride.

* * * * *